(12) United States Patent
Hong

(10) Patent No.: US 8,169,044 B2
(45) Date of Patent: May 1, 2012

(54) IMAGE SENSOR AND METHOD FOR MANUFACTURING THE SAME

(75) Inventor: Ji Hoon Hong, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 168 days.

(21) Appl. No.: 12/548,997

(22) Filed: Aug. 27, 2009

(65) Prior Publication Data

US 2010/0059848 A1 Mar. 11, 2010

(30) Foreign Application Priority Data

Sep. 11, 2008 (KR) .................. 10-2008-0089686

(51) Int. Cl.
*H01L 31/00* (2006.01)

(52) U.S. Cl. ........................................ 257/459
(58) Field of Classification Search .......... 257/459, 257/E2.114, 758, 762; 438/98
See application file for complete search history.

(56) References Cited

U.S. PATENT DOCUMENTS

2008/0157380 A1* 7/2008 Hong .................. 257/751
2009/0065828 A1* 3/2009 Hwang ................ 257/292

FOREIGN PATENT DOCUMENTS

KR 10-2005-0114952 A 12/2005
KR 10-2005-0117674 A 12/2005

* cited by examiner

*Primary Examiner* — N Drew Richards
*Assistant Examiner* — Khalid Ahmed
(74) *Attorney, Agent, or Firm* — Saliwanchik, Lloyd & Eisenschenk

(57) ABSTRACT

Embodiments provide an image sensor. The image sensor includes readout circuitry, an interlayer dielectric, an interconnection, and an image sensing device. The interconnection includes a lower barrier metal and a nitride barrier formed under the lower barrier metal. A contact plug electrically connecting the lower barrier metal to a lower interconnect is formed passing through the nitride barrier.

15 Claims, 3 Drawing Sheets

IMAGE SENSOR AND METHOD FOR MANUFACTURING THE SAME

CROSS-REFERENCE TO RELATED APPLICATION

This application claims the benefit under 35 U.S.C. §119 of Korean Patent Application No. 10-2008-0089686, filed Sep. 11, 2008, which is hereby incorporated by reference in its entirety.

BACKGROUND

The present disclosure relates to an image sensor and a method for manufacturing the same.

An image sensor is a semiconductor device for converting an optical image into an electric signal. The image sensor may be roughly classified into a charge coupled device (CCD) image sensor and a complementary metal oxide semiconductor (CMOS) image sensor (CIS).

During the fabrication of image sensors, a photodiode may be formed in a substrate using ion implantation. As the size of a photodiode is reduced for the purpose of increasing the number of pixels without increasing chip size, the area of a light receiving portion is also reduced, thereby resulting in a reduction in image quality.

Also, since a stack height does not reduce as much as the reduction in the area of the light receiving portion, the number of photons incident to the light receiving portion is also reduced due to diffraction of light called Airy disk.

As an alternative to overcome this limitation, an attempt of forming a photodiode using amorphous silicon (Si), or forming a readout circuitry in a silicon (Si) substrate using a method such as wafer-to-wafer bonding, and forming a photodiode on and/or over the readout circuitry has been made (referred to as a three-dimensional (3D) image sensor). The photodiode is connected with the readout circuitry through a metal interconnection.

In a related art, the photodiode and readout circuitry are connected by a metal line. The metal line often includes a barrier metal to prevent metal corrosion.

For example, when the barrier metal comprises a Ti/TiN structure, the Ti of the lower barrier metal is not fully reacted and remains as titanium. However, the remaining Ti may diffuse into the inter-metal dielectric (IMD) such that the diffused Ti becomes a dark current source.

In addition, since both the source and the drain at sides of the transfer transistor are typically heavily doped with N-type impurities, a charge sharing phenomenon occurs. When the charge sharing phenomenon occurs, the sensitivity of an output image is reduced and an image error may be generated. Also, because a photo charge does not readily move between the photodiode and the readout circuitry, a dark current is generated and/or saturation and sensitivity are reduced.

BRIEF SUMMARY

Embodiments provide an image sensor and the method of the same that can inhibit dark current created by diffused Ti by blocking the Ti diffusion.

Embodiments also provide an image sensor where a charge sharing does not occur while increasing a fill factor and a method for manufacturing the same. Embodiments also provide an image sensor that can minimize a dark current source and inhibit saturation reduction and sensitivity degradation by forming a smooth transfer path of a photo charge between a photodiode and a readout circuit, and a method for manufacturing the same.

According to an embodiment, an image sensor is provided comprising: a readout circuitry on a first substrate; an interlayer dielectric over the first substrate; an interconnection in the interlayer dielectric and electrically connected to the readout circuitry; and an image sensing device over the interconnection and electrically connected to the readout circuitry through the interconnection, wherein the interconnection comprises: a lower barrier metal and a nitride barrier formed under the lower barrier metal.

Also, according to an embodiment, a method of manufacturing the image sensor is provided comprising: forming a readout circuitry on a first substrate; forming an interlayer dielectric over the first substrate; forming an interconnection in the interlayer dielectric and electrically connected to the readout circuitry; and forming an image sensing device over the interconnection and electrically connected to the readout circuitry through the interconnection, wherein forming the interconnection comprises: forming a nitride barrier; and forming a lower barrier metal on the nitride barrier.

DETAILED DESCRIPTION

Hereinafter, an image sensor and a method for manufacturing the same will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
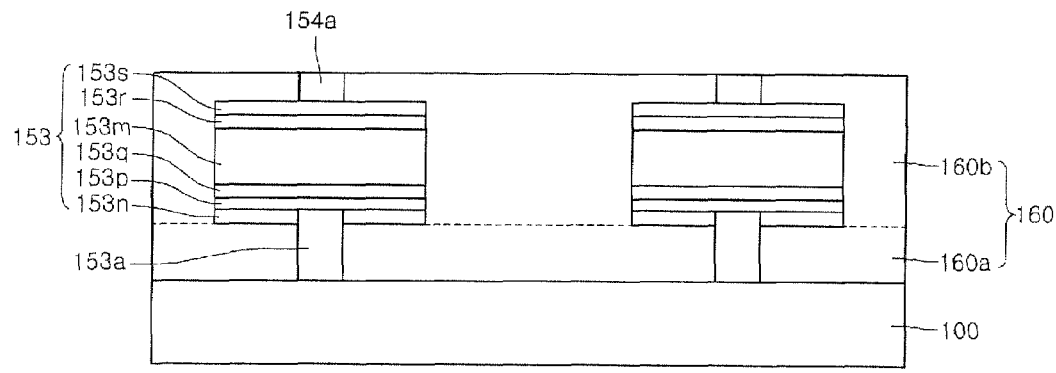
FIG. 1 is a cross-sectional view of an image sensor according to an embodiment.
Figure 2:
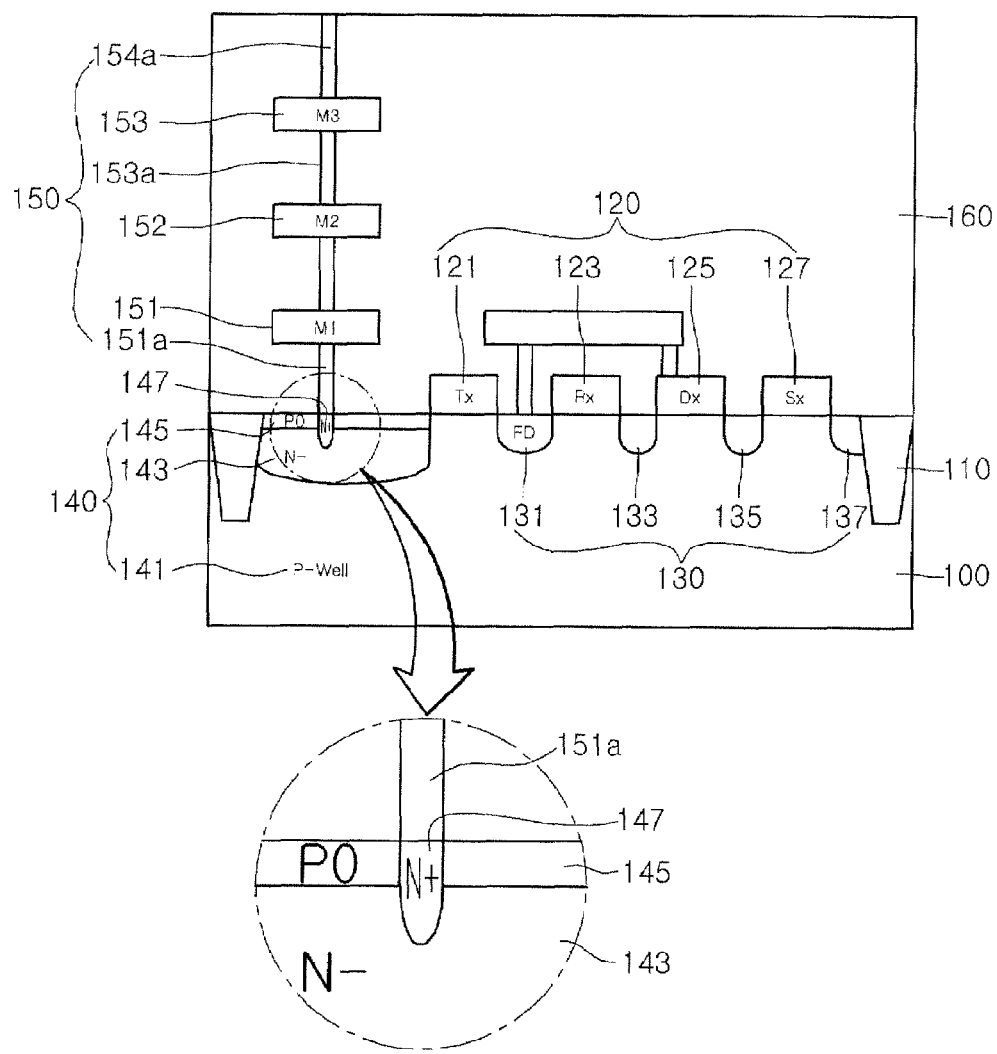
FIGS. 2 to 5 are views illustrating a method for manufacturing an image sensor according to a first embodiment.

FIG. 1 is a cross-sectional view of an image sensor according to an embodiment. FIG. 2 shows a detail view of the substrate 100 and interlayer dielectric 160 according to a first embodiment.

Referring to FIGS. 1 and 2, an image sensor according to a first embodiment includes: a readout circuitry 120 on a first substrate 100; an interlayer dielectric 160 over the first substrate 100; an interconnection 150 in the interlayer dielectric 160 and electrically connected to the readout circuitry 120; and an image sensing device 210 over the interconnection 150 and electrically connected to the readout circuitry 120 through the interconnection 150. As shown in FIG. 1, the interconnection 150 can include: a lower barrier metal (layers 153p, 153q); and a nitride barrier 153n formed under the lower barrier metal (layers 153p, 153q). Although FIG. 1 shows a third metal 153, embodiments are not limited thereto. For example, the nitride barrier may be formed under the lower barrier metal for each layer metal of the interconnection (e.g., first metal 151, second metal 152, and third metal 153).

The image sensing device 210 may be a photodiode. However, embodiments are not limited thereto. For example, the image sensing device 210 may be a photogate, or a combination of the photodiode and the photogate. Embodiments include a photodiode formed in a crystalline semiconductor layer as an example, but without being limited thereto, include a photodiode formed in amorphous semiconductor layer.

Unexplained reference numerals in FIG. 1 will be described with reference to the drawings illustrating a method for manufacturing the image sensor below.

Hereinafter, a method for manufacturing an image sensor according to a first embodiment will be described with reference to FIGS. 2 to 5.

As illustrated in FIG. 2, a first substrate 100 including an interconnection 150 and a readout circuitry 120 is prepared.

An active region is defined by forming a device separation layer 110 in the first substrate 100. The readout circuitry 120 is formed on the active region and may include a transfer transistor (Tx) 121, a reset transistor (Rx) 123, a drive transistor (Dx) 125, and a select transistor (Sx) 127. A floating diffusion region (FD) 131 and an ion implantation region 130 including a source/drain region 133, 135 and 137 for each transistor may be formed. In an embodiment, a noise removal circuit (not shown) may be added to improve sensitivity.

The forming of the readout circuitry 120 on the first substrate 100 may include forming an electrical junction region 140 on the first substrate 100 and forming a first conductive type connection 147 connected to the interconnection 150 at an upper part of the electrical junction region 140.

For example, the electrical junction region 140 may be a P-N junction 140, but is not limited thereto. For example, the electrical junction region 140 may include a first conductive-type ion implantation region 143 formed on a second conductive-type well 141 or a second conductive-type epitaxial layer, and a second conductive-type ion implantation layer 145 formed on the first conductive-type ion implantation region 143. For example, referring to FIG. 2, the P-N junction 140 may be a P0(145)/N-(143)/P-(141) junction, but embodiments are not limited thereto. In addition, the first substrate 100 may be a second conductive type, but embodiments are not limited thereto.

According to an embodiment, the device is designed to provide a potential difference between the source and drain of the transfer transistor (Tx), thereby enabling the full dumping of a photo charge. Accordingly, a photo charge generated in the photodiode is dumped to the floating diffusion region, thereby increasing the output image sensitivity.

That is, referring to FIG. 2, the electrical junction region 140 is formed in the first substrate 100 including the readout circuit 120 to provide a potential difference between the source and drain of the transfer transistor (Tx) 121, thereby implementing the full dumping of a photo charge.

Hereinafter, a dumping structure of a photo charge according to an embodiment will be described in detail.

In an embodiment, unlike a floating diffusion (FD) 131 node having an N+ junction, the P/N/P junction 140 of the electrical junction region 140 is pinched off at a predetermined voltage without an applied voltage being fully transferred thereto. This voltage is called a pinning voltage. The pinning voltage depends on the P0 (145) and N- (143) doping concentration.

Specifically, electrons generated in the photodiode 210 are transferred to the PNP junction 140, and they are transferred to the floating diffusion (FD) 131 node to be converted into a voltage when the transfer transistor (Tx) 121 is turned on.

The maximum voltage of the P0/N-/P-junction 140 becomes the pinning voltage, and the maximum voltage of the FD 131 node becomes $V_{dd}-V_{th\_Rx}$. Therefore, due to a potential difference between the source and drain of the Tx 131, without charge sharing, electrons generated in the photodiode 210 on the chip can be completely dumped to the FD 131 node.

That is, according to this embodiment, instead of an N+/P-well junction a P0/N-/P-well junction is formed in a silicon substrate (Si-Sub) of the first substrate 100. The reason for this is that, in a four transistor active pixel sensor (4-Tr APS) reset operation, a positive (+) voltage is applied to the N-region (143) in the P0/N-/P-well junction and a ground voltage is applied to the P0 region (145) and the P-well (141) and thus a P0/N-/P-well double junction generates a pinch-off at a predetermined voltage or higher like in a BJT structure. This is called a pinning voltage. Thus, a potential difference occurs between the source and drain of the Tx 121, thus making it possible to inhibit a charge sharing phenomenon due to full dumping of photocharges from the N- region at the source to FD through Tx in a Tx on/off operation.

Thus, unlike the related art case of connecting a photodiode simply to an N+ junction, this embodiment makes it possible to inhibit saturation reduction and sensitivity degradation.

Thereafter, a first conductive type connection 147 is formed between the photodiode and the readout circuit to create a smooth transfer path of a photo charge, thereby making it possible to minimize a dark current source and inhibit saturation reduction and sensitivity degradation.

To this end, the first embodiment may form an N+ doping region as a first conductive type connection 147 for an ohmic contact on the surface of the P0/N-/P-junction 140. The N+ region (147) may be formed such that it pierces the P0 region (145) to contact the N- region (143).

On the other hand, the width of the first conductive type connection 147 may be minimized to inhibit the first conductive type connection 147 from being a leakage source. To this end, a plug implant can be performed after etching a contact hole for a first metal contact 151*a*, but embodiments are not limited thereto. As another example, an ion implantation pattern (not shown) may be formed, and the first conductive type connection 147 may be formed using the ion implantation pattern as an ion implantation mask.

That is, a reason why an N+ doping is locally performed only on a contact formation region as described in the first embodiment is to minimize a dark signal and implement the smooth formation of an ohmic contact. If the entire width of the Tx source region is N+ doped like the related art, a dark signal may increase due to a Si surface dangling bond.

Next, an interlayer dielectric 160 may be formed on the first substrate 100, and an interconnection 150 may be formed. The interconnection 150 may include the first metal contact 151*a*, a first metal 151, a second metal 152, a third metal 153, and a fourth metal contact 154*a*, but embodiments are not limited thereto.

Hereinafter, a method for manufacturing the third metal 153 including a nitride barrier 153*n* will be described with reference to FIGS. 3 to 4.

A first metal 151 and a second metal 152 can be formed on the first substrate 100, and a first interlayer dielectric 160*a* is formed on the second metal 152.

Figure 3:
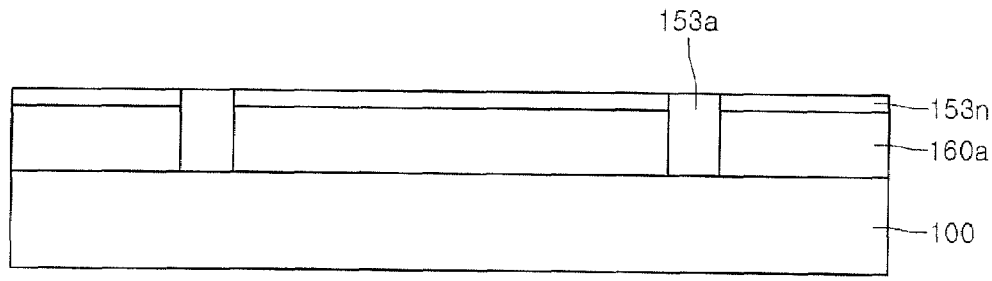

Then referring to FIG. 3, a nitride barrier 153*n* is formed on the first interlayer dielectric 160*a*. For example, SiN can be formed on the first interlayer dielectric 160*a*, but embodiments are not limited thereto.

Next, a third metal contact 153*a* can be formed by a via hole process through the nitride barrier 153*n*.

Figure 4:
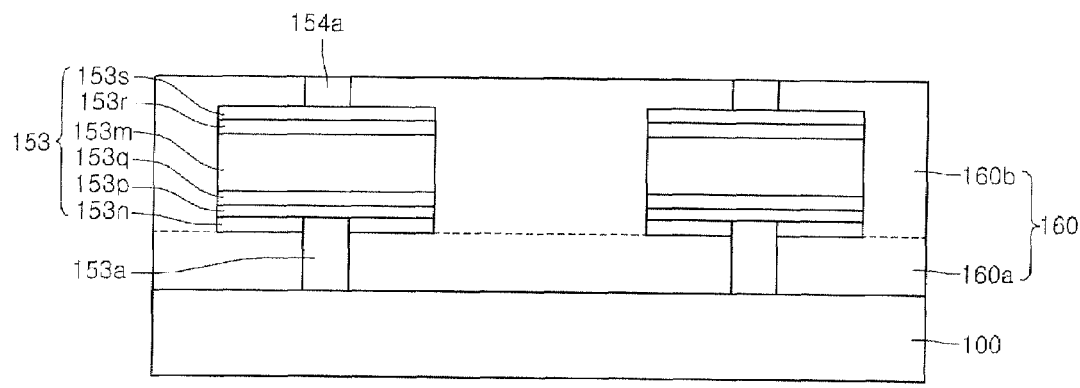

Referring to FIG. 4, a lower barrier, such as layers 153p and 153q, a third metal line 153m and an upper barrier, such as layers 153r and 153s, can be formed. For example, the lower barrier 153p, 153q can be a stacked layer structure of Ti(153p) and TiN(153q). In an embodiment, the third metal line 153m can be Al. In addition, the upper barrier 153r, 153s can be a stacked layer structure of Ti(153r) and TiN(153s). Of course, embodiments are not limited thereto.

Next, after a metal patterning process, the third metal 153 can be formed by sequentially etching the upper barrier 153r, 153s, third metal line 153m and the lower barrier 153p, 153q.

At this time, the nitride barrier 153n can be separated in each pixel by over etching the lower barrier 153p, 153q.

Then a second interlayer dielectric 160b is formed on the etched space (e.g., on and between the third metal 153), and a fourth metal contact 154a can be formed after performing a via hole process exposing the upper barrier (e.g., layer 153s of the 153r, 153s layers of the upper barrier).

Embodiments provide an image sensor that inhibits dark current by forming a nitride barrier blocking Ti diffusion.

Figure 5:
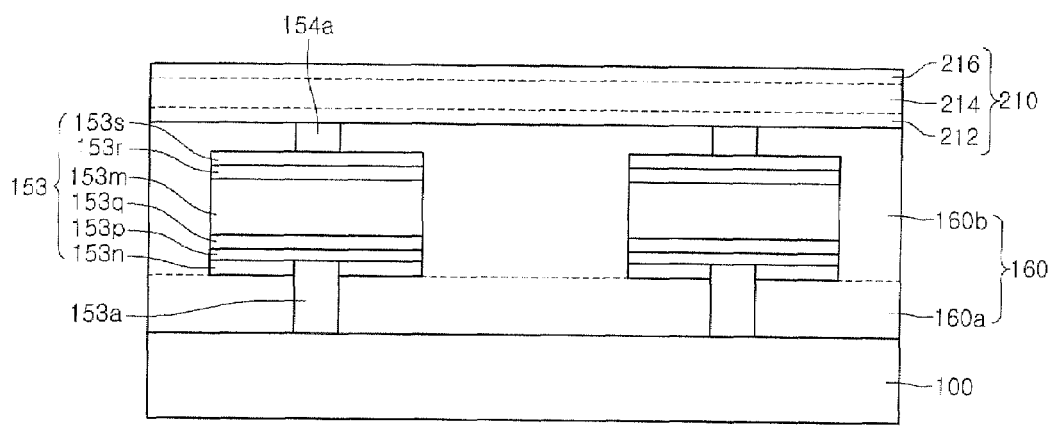

As illustrated in FIG. 5, an image sensing device 210 can be formed over the interconnection 150.

For example, a image sensing device 210 including a high-concentration P-type conductive layer 216, a low-concentration N-type conductive layer 214, and a high-concentration N-type conductive layer 212 may be formed by implanting ions into a crystalline semiconductor layer of a second substrate (not shown), but embodiments are not limited thereto.

Next, after the second substrate where the image sensing device 210 is formed is bonded to the interconnection 150, the second substrate is removed to leave the image sensing device 210.

Then, the image sensing device 210 can be separated according to unit pixel and an upper electrode (not shown) and color filter (not shown) can be formed on the image sensing device 210.

Figure 6:
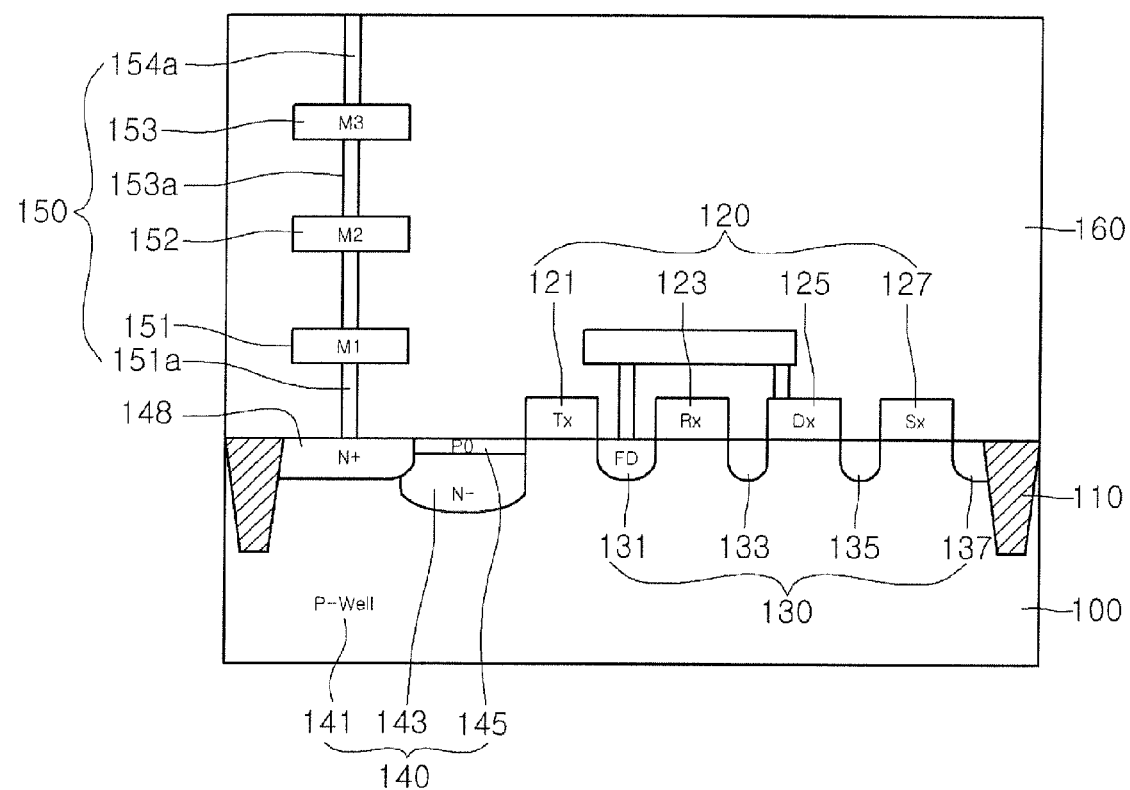
FIG. 6 is a cross-sectional view of an image sensor according to another embodiment.

FIG. 6 is a cross-sectional view of an image sensor according to a second embodiment, and shows a detail view of a first substrate including an interconnection 150 formed therein.

A second embodiment provides an image sensor comprising: a readout circuitry 120 on a first substrate 100; an interlayer dielectric 160 over the first substrate 100; an interconnection 150 in the interlayer dielectric 160 and electrically connected to the readout circuitry 120; and an image sensing device 210 over the interconnection 150 and electrically connected to the readout circuitry 120 through the interconnection 150. The interconnection 150 includes a nitride barrier 153n formed under a lower barrier metal 153p, 153q. The nitride barrier may be formed under the lower barrier metal for each layer metal of the interconnection.

The second embodiment may adopt the technical features of the first embodiment.

However, unlike the first embodiment, a first conductive type connection 148 is formed at one side of the electrical junction region 140.

According to the second embodiment, the device is designed to provide a potential difference between the source and drain of the transfer transistor (Tx), thereby enabling the full dumping of a photo charge.

According to the second embodiment, a charge connection region is formed between a photodiode and a readout circuit to create a smooth transfer path of a photo charge, thereby making it possible to minimize a dark current source and inhibit saturation reduction and sensitivity degradation.

An N+ connection region 148 may be formed at a P0/N-/P-junction 140 for an ohmic contact. In this case, a leakage source may be generated during the formation process of an N+ connection region 148 and a first contact plug 151a. This is because an electric field (EF) may be generated over the Si surface due to operation while a reverse bias is applied to the P0/N-/P-junction 140. A crystal defect generated during the contact formation process inside the electric field may become a leakage source.

Also, when the N+ connection region 148 is formed over the surface of the P0/N-/P-junction 140, an electric field may be additionally generated due to the N+/P0 junction 148/145. This electric field may also become a leakage source.

Therefore, the second embodiment proposes a layout in which the first contact plug 151a is formed in an active region not doped with a P0 layer, but including N+ connection region 148 that is connected to the N− region 143.

According to the second embodiment, the electric field is not generated on and/or over the Si surface. Accordingly, a dark current of a 3D integrated CIS can be further reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
    a readout circuitry on a first substrate;
    an interlayer dielectric over the first substrate;
    an interconnection in the interlayer dielectric and electrically connected to the readout circuitry; and
    an image sensing device over the interconnection and electrically connected to the readout circuitry through the interconnection,
    wherein the interconnection comprises:
    a nitride barrier;
    a lower barrier metal on the barrier;
    an upper barrier metal on the metal layer; and
    a contact plug through the nitride barrier,
    wherein the lower barrier metal is formed on and contacts the contact plug and the nitride barrier,
    wherein a lateral width of the nitride barrier is substantially the same as a lateral width of the lower barrier metal.

2. The image sensor according to claim 1, further comprising an electrical junction region in the first substrate and electrically connecting the interconnection to the readout circuitry.

3. The image sensor according to claim 2, wherein the electrical junction region comprises:
    a first conductive type ion implantation region in the first substrate; and a second conductive type ion implantation region over the first conductive type ion implantation region.

4. The image sensor according to claim 2, wherein the readout circuitry has a potential difference between a source and a drain of a transistor, the electrical junction region being at the source of the transistor.

5. The image sensor according to claim 2, wherein the electrical junction region is a PN junction.

6. The image sensor according to claim 2, further comprising a first conductive type connection between the electrical junction region and the interconnection.

7. The image sensor according to claim 6, wherein the first conductive type connection is electrically connected to the interconnection at an upper part of the electrical junction region.

8. The image sensor according to claim 6, wherein the first conductive type connection is at one side of the electrical junction region and electrically connects the interconnection to the electrical junction region.

9. A method for manufacturing an image sensor comprising:
    forming a readout circuitry on a first substrate;
    forming an interlayer dielectric over the first substrate;
    forming an interconnection in the interlayer dielectric and electrically connected to the readout circuitry; and
    forming an image sensing device over the interconnection and electrically connected to the readout circuitry through the interconnection,
    wherein forming the interconnection comprises:
    forming a nitride barrier;
    forming a contact plug through the nitride barrier;
    forming a lower barrier metal on the contact plug and the nitride barrier;
    forming a metal layer on the lower barrier metal; and
    forming an upper barrier metal on the metal layer,
    wherein the lower barrier metal is formed on and contacts the contact plug and the nitride barrier,
    wherein a lateral width of the nitride barrier is substantially the same as a lateral width of the lower barrier metal.

10. The method according to claim 9, further comprising forming an electrical junction region in the first substrate, wherein the electrical junction region electrically connects the interconnection to the readout circuitry.

11. The method according to claim 10, wherein the forming of the electrical junction region comprises:
    forming a first conductive type ion implantation region in the first substrate; and
    forming a second conductive type ion implantation region on the first conductive type ion implantation region.

12. The method according to claim 10, wherein the electrical junction region is a PN junction.

13. The method according to claim 10, further comprising forming a first conductive type connection between the electrical junction region and the interconnection.

14. The method according to claim 13, wherein the first conductive type connection is electrically connected to the interconnection at an upper part of the electrical junction region.

15. The method according to claim 13, wherein the first conductive type connection is formed at one side of the electrical junction region and electrically connects the interconnection to the electrical junction region.

* * * * *